(12) United States Patent
Li et al.

(10) Patent No.: US 7,998,776 B1
(45) Date of Patent: Aug. 16, 2011

(54) METHODS FOR MANUFACTURING MEMS SENSOR AND THIN FILM THEREOF WITH IMPROVED ETCHING PROCESS

(75) Inventors: Gang Li, Suzhou City (CN); Wei Hu, Suzhou (CN)

(73) Assignee: Memsensing Microsystems Technology Co., Ltd., Suzhou, Jiangsu Province (CN)

( * ) Notice: Subject to any disclaimer, the term of this patent is extended or adjusted under 35 U.S.C. 154(b) by 0 days.

(21) Appl. No.: 12/910,801

(22) Filed: Oct. 23, 2010

Related U.S. Application Data

(63) Continuation-in-part of application No. 12/813,503, filed on Jun. 10, 2010.

(30) Foreign Application Priority Data

Aug. 11, 2010 (CN) .......................... 2010 1 0261039

(51) Int. Cl.
H01L 21/00 (2006.01)
(52) U.S. Cl. ................ 438/53; 438/48; 438/50; 438/52; 257/419; 257/E21.001; 257/E27.122
(58) Field of Classification Search .................... 438/48, 438/50, 52, 53; 257/419, E21.001, E27.122
See application file for complete search history.

(56) References Cited

U.S. PATENT DOCUMENTS

| | | | |
|---|---|---|---|
| 7,242,089 B2 | 7/2007 | Minervini | |
| 7,354,786 B2 | 4/2008 | Benzel et al. | |
| 7,630,589 B2 | 12/2009 | Kilic et al. | |
| 7,645,627 B2 * | 1/2010 | Christenson et al. | 438/53 |
| 2009/0278628 A1 * | 11/2009 | Sworowski et al. | 333/186 |

* cited by examiner

*Primary Examiner* — Matthew Smith
*Assistant Examiner* — Wilner Jean Baptiste
(74) *Attorney, Agent, or Firm* — Cheng-Ju Chiang

(57) ABSTRACT

A method for manufacturing a MEMS sensor and a thin film thereof includes steps of etching a top surface of a single-crystal silicon wafer in combination of a deposition process, an isotropic DRIE process, a wet etching process and a back etching process in order to form a pressure-sensitive single-crystal silicon film, a cantilever beam, a mass block, a front chamber, a back chamber and trenches connecting the front and the back chambers. The single-crystal silicon film is prevented from etching so that the thickness thereof can be well controlled. The method of the present invention can be used to replace the traditional method which forms the back chamber and the pressure-sensitive single-crystal silicon film from the bottom surface of the silicon wafer.

20 Claims, 11 Drawing Sheets

METHODS FOR MANUFACTURING MEMS SENSOR AND THIN FILM THEREOF WITH IMPROVED ETCHING PROCESS

CROSS-REFERENCE TO RELATED APPLICATIONS

This application is a continuation-in-part of U.S. patent application Ser. No. 12/813,503 filed on Jun. 10, 2010, entitled "METHODS FOR MANUFACTURING MEMS SENSOR AND THIN FILM AND CANTILEVER BEAM THEREOF WITH EPITAXIAL GROWTH PROCESS".

BACKGROUND OF THE INVENTION

1. Field of the Invention

The present invention relates to a method for manufacturing a MEMS sensor on a same single-crystal silicon wafer, and methods for fabricating a thin film of such MEMS sensor with improved etching processes.

2. Description of Related Art

Micro-Electro-Mechanical Systems (MEMS) is a high technology rapidly developed in recent years. MEMS components can be manufactured by advanced semiconductor manufacturing processes to realize mass production. Compared with the traditional electronic components, the MEMS components are more competitive in profile, power consumption, weight and price etc.

Usually, a MEMS condenser includes micro structures such as a thin film, a mass block and a cantilever beam etc. The traditional method for manufacturing such thin film uses surface sacrificial processes which include steps of: (i) fabricating a sacrificial layer by a Low Pressure Chemical Vapor Deposition (LPCVD) process or a Plasma Enhanced Chemical Vapor Deposition (PEVCD) process or a Physical Vapor Deposition (PVD) process; (ii) fabricating a thin film on the sacrificial layer by the fore deposition methods; and (iii) etching the sacrificial layer under the thin film to release the thin film to be movable micro structures. Such method can be used to fabricate a polysilicon thin film, a metal thin film or a medium thin film etc. However, such method is not suitable to fabricate a single-crystal silicon film.

Pressure sensors are those MEMS sensors earliest appear to be used. The pressure sensors are divided into a piezoresistive type, a capacitive type and a piezoelectric type etc. The piezoresistive pressure sensor has advantages of mass output signals, simple follow-up processing and easy for mass production. However, the piezoresistive pressure sensors are usually fabricated on the single-crystal pressure-sensitive silicon film. In mass production, it is a key guideline to keep the uniformity thickness of the pressure-sensitive silicon films of the piezoresistive pressure sensors. The current method for fabricating the pressure-sensitive silicon film is to anisotropically etch the single-crystal silicon wafer from its bottom side via a kind of alkaline liquor. As a result, a back chamber is formed at the bottom side of the single-crystal silicon wafer, and meanwhile, the pressure-sensitive silicon film is formed at the top side of the single-crystal silicon wafer. In order to control the thickness of the pressure-sensitive silicon film, a time controlling method is selected. However, such method can not uniform the thickness of the inside and outside pressure-sensitive silicon films. Another method is to use the highly doped silicon film to control the thickness of the pressure-sensitive silicon film. However, since the piezoresistances cannot be fabricated on the highly doped silicon film, such method is not suitable to manufacture the pressure-sensitive silicon films of the piezoresistive pressure sensors. Another method is to use electrochemical etching to achieve the lowly doped silicon film which can be used to fabricate piezoresistances. However, such method needs additional apparatus, such as expensive potentiostats and clip tools for protecting the silicon wafer. The cost is accordingly enhanced and the manufacture efficiency is decreased due to additional processes.

Acceleration sensors are other kinds of MEMS sensors and are divided into a piezoresistive type, a capacitive type and a piezoelectric type etc. The piezoresistive type acceleration sensor needs to fabricate piezoresistances on its cantilever beam in order to detect the acceleration. Usually, the cantilever beam is fabricated from a single-crystal silicon film, which still meets the problems described in the above piezoresistive pressure sensors.

Hence, it is desired to have improved methods for manufacturing a MEMS sensor and its thin film.

BRIEF SUMMARY OF THE INVENTION

The present invention discloses a method for manufacturing a thin film of a MEMS sensor, comprising steps of:

a) forming a medium layer on a top surface of a single-crystal silicon wafer via a deposition process, and the medium layer functioning as a mask layer;

b) partly removing the medium layer in order to form a mask diagram;

c) etching the single-crystal silicon wafer from the mask diagram via a Deep Reactive Ion Etching (DRIE) process to form a plurality of trenches extending into an inner side of the single-crystal silicon wafer;

d) partly etching the single-crystal silicon wafer through the mask diagram via an independent isotropic DRIE process, to form an inner chamber and a plurality of remainder single-crystal silicon chips under the medium layer, the trenches being in communication with the inner chamber, the remainder single-crystal silicon chips forming a meshwork silicon film;

e) removing the medium layer from the single-crystal silicon wafer in order to expose the meshwork silicon film, via a dry etching process or a wet etching process; and f) finally, expanding a single-crystal silicon film based on the meshwork silicon film via an epitaxial growth process, the single-crystal silicon film covering the meshwork silicon film to shield the trenches, the inner chamber being located under the single-crystal silicon film.

A method for manufacturing a thin film of a MEMS sensor comprises steps of:

a) forming a medium layer on a top surface of a single-crystal silicon wafer via a deposition process, and the medium layer functioning as a mask layer;

b) partly removing the medium layer in order to form a mask diagram;

c) etching the single-crystal silicon wafer from the mask diagram via a Deep Reactive Ion Etching (DRIE) process to form a plurality of trenches extending into an inner side of the single-crystal silicon wafer;

d) partly etching the single-crystal silicon wafer through the mask diagram via an anisotropic DRIE process together with an anisotropic etching process, or an independent anisotropic DRIE process, or an independent isotropic DRIE process, to form an inner chamber and a plurality of remainder single-crystal silicon chips under the medium layer, the trenches being in communication with each other through the inner chamber, the remainder single-crystal silicon chips forming a meshwork silicon film;

e) removing the medium layer from the single-crystal silicon wafer in order to expose the meshwork silicon film, via a dry etching process or a wet etching process;

f) forming a deposition layer filled in the trenches so as to close the inner chamber, the deposition layer further covering the top surface of the single-crystal silicon wafer; and g) finally, removing the unwanted deposition layer which covers the top surface of the single-crystal silicon wafer while leaving the deposition layer filled in the trenches, the meshwork silicon film and the deposition layer filled in the trenches being exposed to an exterior and jointly forming the thin film.

A method for manufacturing a piezoresistive pressure sensor and an acceleration sensor on a same single-crystal silicon wafer, the single-crystal silicon wafer being divided into a first area for fabricating the piezoresistive pressure sensor and a second area for fabricating the acceleration sensor, the method comprising steps of:

a) etching a top surface of the single-crystal silicon wafer to form a first deep hole at the first area and a second deep hole at the second area;

b) depositing a medium layer on the top surface of the single-crystal silicon wafer under an arrangement that the medium layer fills in the first and the second deep holes to form first and second sacrificial layers, respectively;

c) partly etching the single-crystal silicon wafer through the medium layer to form first and second chambers and a plurality of remainder single-crystal silicon chips under the medium layer, the first and the second chambers being located at the first and the second areas, respectively, the single-crystal silicon wafer being etched to terminate at the first sacrificial layer which is located adjacent to the first chamber, and the single-crystal silicon wafer being etched to terminate at the second sacrificial layer which is located adjacent to the second chamber;

d) removing the medium layer from the single-crystal silicon wafer at both the first and the second areas, while leaving the first and the second sacrificial layer;

e) fabricating a single-crystal silicon film at the first and the second areas, and then fabricating a first piezoresistance on the single-crystal silicon film at the first area, and a second piezoresistance on the single-crystal silicon film at the second area, the first and the second piezoresistances being electrically extended to an exterior;

f) forming first and second back cavities from a bottom surface of the single-crystal silicon wafer under a condition that the first back cavity and the first chamber are separated from each other by the first sacrificial layer, and the second back cavity and the second chamber are separated from each other by the second sacrificial layer; and g) finally, removing the first and the second sacrificial layers so as to communicating the first back cavity with the first chamber, the second back cavity communicating with the second chamber to release a mass block movable in the second chamber, the mass block being adapted for sensing the acceleration.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

FIGS. 1-7(b) are schematic views showing steps for manufacturing a thin film of a MEMS sensor according to a first embodiment of the present invention;

DETAILED DESCRIPTION OF THE PREFERRED EMBODIMENTS

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Please refer to FIGS. 1-7(b), a method for fabricating a thin film of a MEMS sensor according to a first embodiment of the present invention is disclosed and includes the following steps.

Figure 1:
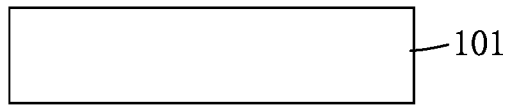
Figure 2:

Please refer to FIGS. 1 and 2, firstly, a medium layer 102 is formed on a top surface of a single-crystal silicon wafer 101 via a deposition process, such as a Low Pressure Chemical Vapor Deposition (LPCVD) process or a Plasma Enhanced Chemical Vapor Deposition (PEVCD) process or a thermal oxidation process. The medium layer 102 is made of silicon oxide or silicon nitride to function as a mask layer in subsequent etching processes.

Figure 3:
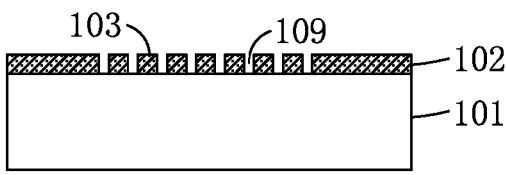

Secondly, referring to FIG. 3, the medium layer 102 is partly removed via an etching process, such as a photo etching process or a dry etching process or a wet etching process, in order to form a meshwork mask diagram 103.

Figure 4:
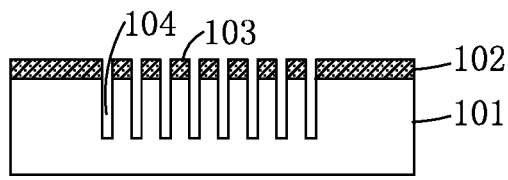
Figure 8:
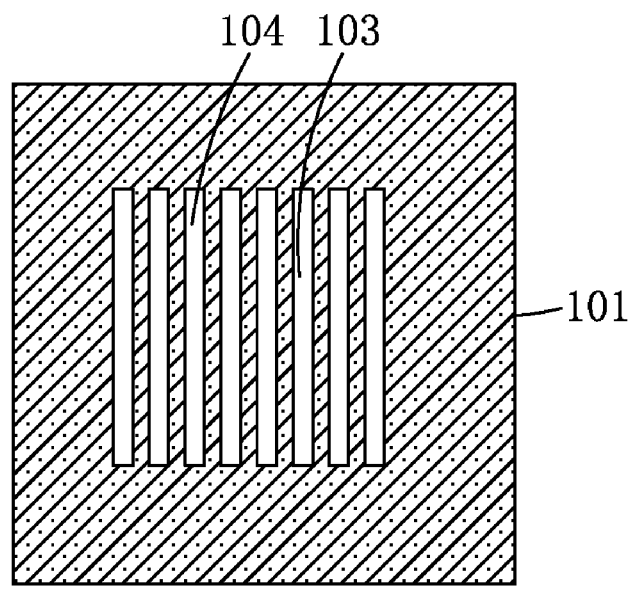
FIG. 8 is a schematic cross-sectional view of trenches and a mask diagram of the thin film.
Figure 9:
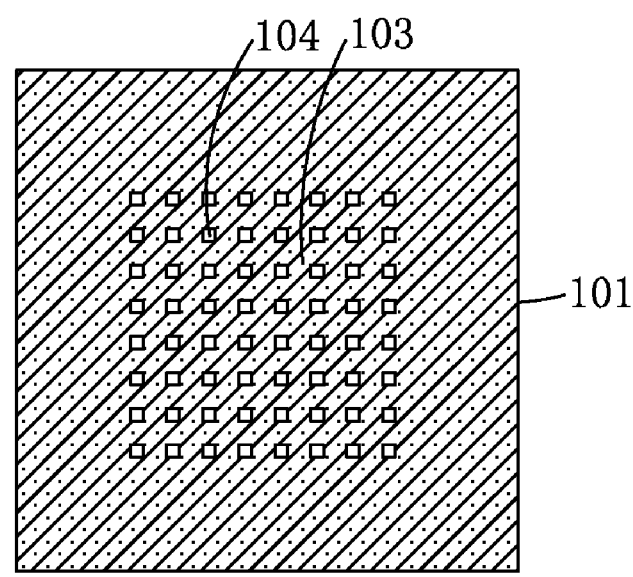
FIG. 9 is another schematic cross-sectional view of the trenches and the mask diagram shown in FIG. 8, alternatively.

Thirdly, referring to FIG. 4, a plurality of trenches 104 are formed by etching the single-crystal silicon wafer 101 through the mask diagram 103 via a Deep Reactive Ion Etching (DRIE) process. The trenches 104 further extend into an inner side of the single-crystal silicon wafer 101. As shown in FIGS. 8 and 9, the shapes of the trenches 104 can be square or rectangular or round. The dimensions of the trenches 104 are determined by the actual design.

Figure 5:
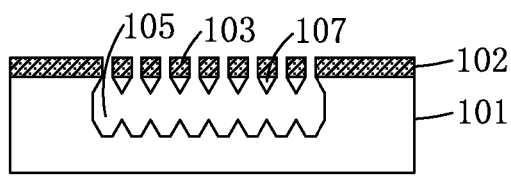

Fourthly, referring to FIGS. 5(*a*) and 5(*b*), the single-crystal silicon wafer 101 is then partly etched through the mask diagram 103 via an anisotropic DRIE process together with an anisotropic etching process, or an independent anisotropic DRIE process, or an independent isotropic DRIE process, to form an inner chamber 105 and a plurality of remainder single-crystal silicon chips 107 located under the medium layer 102. Such remainder single-crystal silicon chips 107 form a meshwork silicon film. The trenches 104 are in communication with each other through the inner chamber 105 inside the single-crystal silicon wafer 101. Referring to FIG. 5(*a*), the anisotropic etching process includes infusing KOH or tetramethylammonium hydroxide (TMAH) into the trenches 104 so as to etch the single-crystal silicon wafer 101. Because of the anisotropic characteristic of such etching process, each remainder single-crystal silicon chip 107 is etched to form a contractive end 1071 facing the inner chamber 105. According to the preferred embodiment of the present invention, the contractive end 1071 has an inverted triangle shaped cross section taken along a vertical plane. Alternatively, the cross section can be of other shapes, such as rectangular etc.

If the anisotropic DRIE process is selected as an etching process, a reactive ion is radiated into the single-crystal silicon wafer 101 through the trenches 104. Under suitable technical parameter, the meshwork silicon film 107 can be formed as well.

Referring to FIG. 5(*b*), if the isotropic DRIE process is selected as an etching process, because of the isotropic characteristic of such etching process, the inner side of the inner chamber 105 is of curved surfaces.

Besides, the above-mentioned anisotropic DRIE process together with the anisotropic etching process can be combined to form the meshwork silicon film 213 as well.

Figure 6:
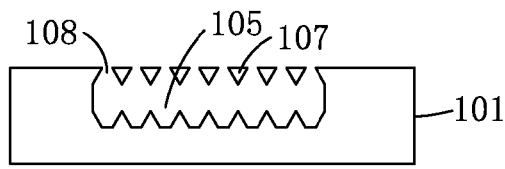

Fifthly, referring to FIGS. 6(*a*) and 6(*b*), the medium layer 102 is then removed from the single-crystal silicon wafer 101 in order to expose the meshwork silicon film, via a dry etching process such as a reactive ion etching process, or a wet etching process such as using the Buffered Oxide Etchant (BOE). Thereafter, a plurality of small holes 108 are formed at the top surface of the single-crystal silicon wafer 101. The small holes 108 and the trenches 104 have the same transverse dimensions.

Figure 7:
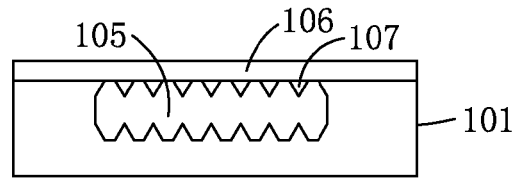
Figure 5:
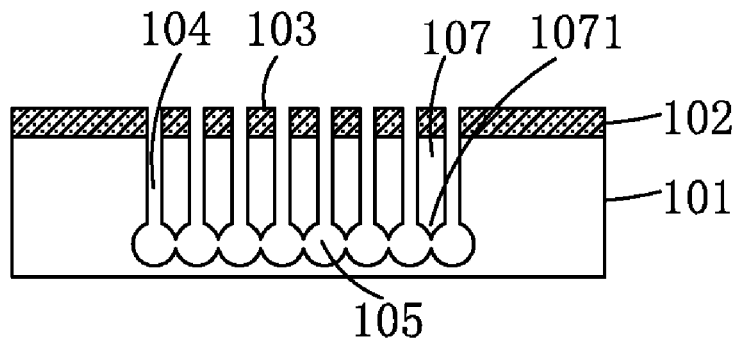
Figure 6:
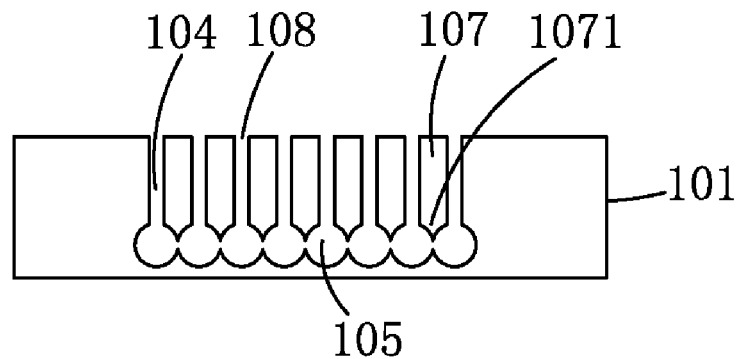
Figure 7:
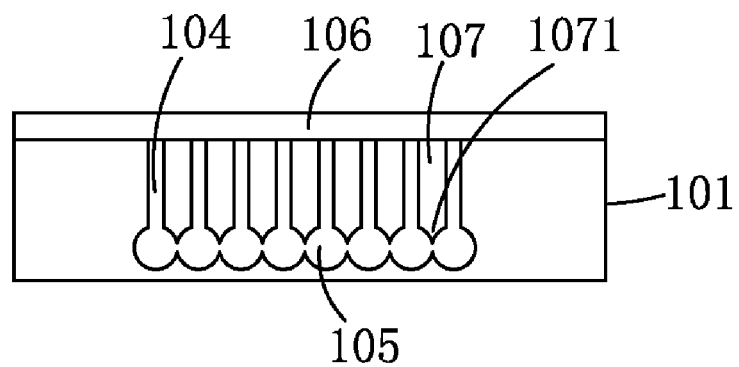

Finally, referring to FIGS. 7(*a*) and 7(*b*), an integrate single-crystal silicon film 106 is then expanded based on the meshwork silicon film via an epitaxial growth process. The single-crystal silicon film 106 fills in the small holes 108 because the epitaxial growth process is isotropic. Since the small holes 108 are small in size, the reactive gas cannot easily enter the inner chamber 105. As a result, the single-crystal silicon film 106 covers the meshwork silicon film and shields the trenches 104. The thickness of the independent single-crystal silicon film 106 is easy to control because the single-crystal silicon film 106 lastly grows. The inner chamber 105 is located under the single-crystal silicon film 106. The single-crystal silicon film 106 can be used as a pressure-sensitive film of a pressure sensor or a diaphragm of other components.

Besides, the single-crystal silicon film 106 can not be etched in the subsequent etching processes as a result that the thickness of the single-crystal silicon film 106 can be well controlled. The traditional etching process with the silicon wafer etched from its bottom surface can't prevent the diaphragm from further being etched. As a result, the thickness of the diaphragm can't be well controlled. However, the current fabrication method of the first embodiment of the present invention can overcome such difficulty of the traditional method. Besides, the current fabrication method is simple and useful because no additional apparatus, such as the expensive potentiostats or clip tools for protecting the silicon wafer, is needed.

Please refer to FIGS. 41-48, another method for fabricating a thin film of a MEMS sensor according to an alternative embodiment of the present invention is disclosed and includes the following steps.

Figure 41:
FIGS. 41-48 are schematic views showing steps for manufacturing a thin film of a MEMS sensor similar to FIGS. 1-7(b), according to an alternative embodiment of the present invention.
Figure 42:

Please refer to FIGS. 41 and 42, firstly, a medium layer 402 is formed on a top surface of a single-crystal silicon wafer 401 via a deposition process, such as a Low Pressure Chemical Vapor Deposition (LPCVD) process or a Plasma Enhanced Chemical Vapor Deposition (PEVCD) process or a thermal oxidation process. The medium layer 402 is made of silicon oxide or silicon nitride to function as a mask layer in subsequent etching processes.

Figure 43:
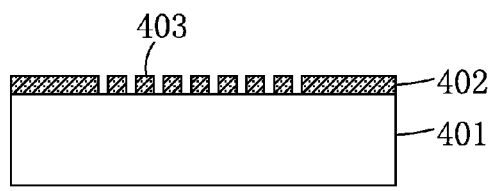

Secondly, referring to FIG. 43, the medium layer 402 is partly removed via an etching process, such as a photo etching process or a dry etching process or a wet etching process, in order to form a meshwork mask diagram 403.

Figure 44:
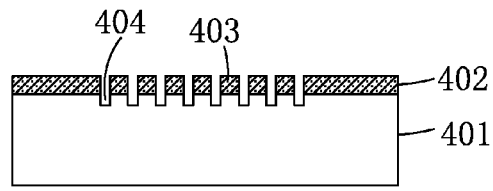

Thirdly, referring to FIG. 44, a plurality of trenches 404 are formed by etching the single-crystal silicon wafer 401 through the mask diagram 403 via a Deep Reactive Ion Etching (DRIE) process. According to different etching selectivities of the single-crystal silicon wafer 401 and the medium layer 402, the plurality of trenches 401 can be finally formed. The trenches 404 are similar to the trenches 104 as shown in FIGS. 4, 8 and 9. The trenches 404 further extend into an inner side of the single-crystal silicon wafer 401. The shapes of the trenches 404 can be square or rectangular or round etc. and the dimensions of the trenches 404 are determined by the actual design.

Figure 45:
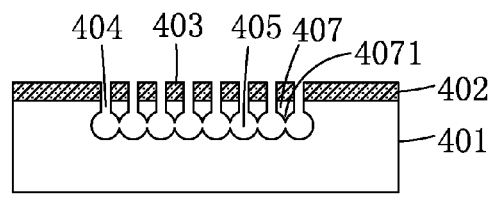

Fourthly, referring to FIG. 45, a passivation layer is formed covering the inner sides of the trenches 404 in a passivation process. Then an isotropic DRIE process is selected by radiating reactive ion into the single-crystal silicon wafer 401 through the trenches 404. As a result, because of the isotropic characteristic of such etching process, an inner chamber 405 is formed and a plurality of remainder single-crystal silicon chips 407 are located under the medium layer 402. Such remainder single-crystal silicon chips 407 form a meshwork silicon film. The trenches 404 are in communication with each other through the inner chamber 405 inside the single-crystal silicon wafer 401. Referring to FIG. 45, each remainder single-crystal silicon chip 407 is etched to form a contractive end 4071 facing the inner chamber 405. According to the preferred embodiment of the present invention, the contractive end 4071 has an inverted triangle shaped cross section taken along a vertical plane. Alternatively, the cross section can be of other shapes, such as rectangular etc.

Figure 46:
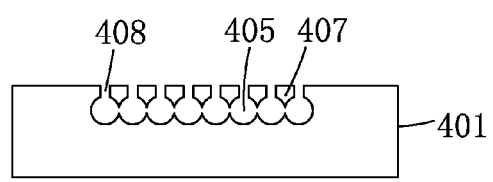

Fifthly, referring to FIG. 46, the medium layer 402 is then removed from the single-crystal silicon wafer 401 in order to expose the meshwork silicon film, via a dry etching process such as a reactive ion etching process, or a wet etching process such as using the Buffered Oxide Etchant (BOE). Thereafter, a plurality of small holes 408 are formed at the top surface of the single-crystal silicon wafer 401. The small holes 408 and the trenches 404 have the same transverse dimensions.

Figure 47:
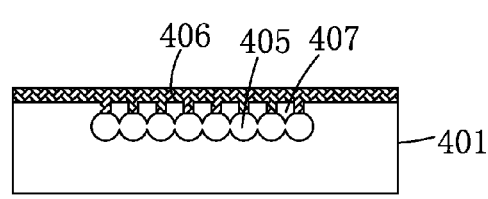

Sixthly, referring to FIG. 47, a deposition layer 406 is formed covering the top surface of the single-crystal silicon wafer 401 in a deposition process. The deposition layer 406 is made of polycrystalline silicon or silicon oxide. Because of the isotropic characteristic of the deposition process, the deposition layer 406 fills in the trenches 404 so as to close the inner chamber 405. Besides, the deposition layer 406 further covers the remainder single-crystal silicon chips 407 of the meshwork silicon film when the deposition layer 406 is thick enough. Since the small holes 408 are small in size, reactive gas produced in the deposition process can not easily enter into the inner chamber 405 through the trenches 404 so that the inner side of the inner chamber 405 is prevented from being deposited with the deposition layer 406.

Figure 48:
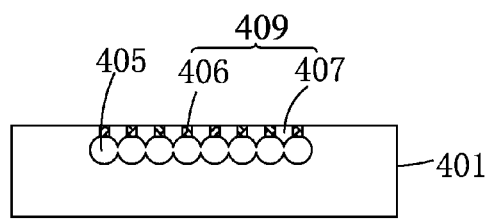

Finally, referring to FIG. 48, the unwanted deposition layer 406 covering the remainder single-crystal silicon chips 407 of the meshwork silicon film is then removed via etching processes. However, the deposition layer 406 filled in the trenches 404 are saved in the etching processes. As a result, the meshwork silicon film and the deposition layer 406 filled in the trenches 404 are combined and exposed to ultimately form the thin film 409 of the MEMS sensor according to the alternative embodiment of the present invention. The thin film 409 can be used as a pressure-sensitive film or a pressure sensor or as a diaphragm of other components. The remainder single-crystal silicon chips 407 of the meshwork silicon film are exposed to the exterior to provide a base for fabricating piezoresistances.

Besides, the thin film 409 can not be etched in the subsequent etching processes as a result that the thickness of the thin film 409 can be well controlled. The traditional etching process with the silicon wafer etched from its bottom surface can't prevent the diaphragm from further being etched. As a result, the thickness of the diaphragm can't be well controlled. However, the current fabrication method of the alternative embodiment of the present invention can overcome such difficulty of the traditional method. Besides, the current fabrication method is simple and useful because no additional apparatus, such as the expensive potentiostats or clip tools for protecting the silicon wafer, is needed.

Please refer to FIGS. 10-16, a method for fabricating a mass block of a MEMS sensor according to a second embodiment of the present invention is disclosed and includes the following steps.

Figure 10:
FIGS. 10-15 are schematic views showing steps for manufacturing a mass block of a MEMS sensor according to another embodiment of the present invention.
Figure 11:
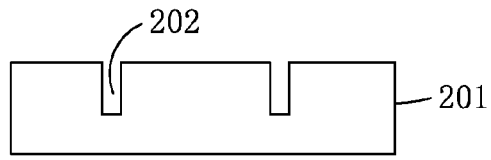

Please refer to FIGS. 10 and 11, firstly, a top surface of a single-crystal silicon wafer 201 is etched via an etching process, such as a photo etching process or a dry etching process or a wet etching process, in order to form a deep hole 202. The deep hole 202 further extends into an inner side of the single-crystal silicon wafer 201.

Figure 12:
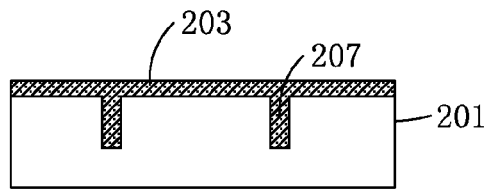

Secondly, referring to FIG. 12, a medium layer 203 is then formed on the top surface of the single-crystal silicon wafer 201 via a deposition process, such as a Low Pressure Chemical Vapor Deposition (LPCVD) process or a Plasma Enhanced Chemical Vapor Deposition (PEVCD) process or a thermal oxidation process. The medium layer 203 is made of silicon oxide or silicon nitride and fills in the deep hole 202 to form a sacrificial layer 207.

Figure 13:
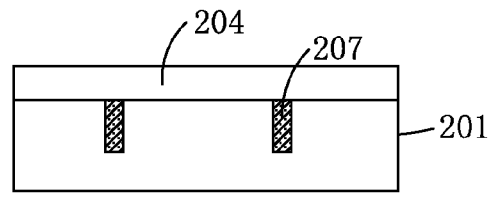

Thirdly, referring to FIG. 13, the medium layer 203 is removed by Buffered Oxide Etchant (BOE). However, the sacrificial layer 207 is not etched by the prior etching process and still exists because of the protection characteristics of such etching process. Then, an integrate single-crystal silicon film 204 is expanded via an epitaxial growth process to cover the top surface of the single-crystal silicon wafer 201.

Figure 14:
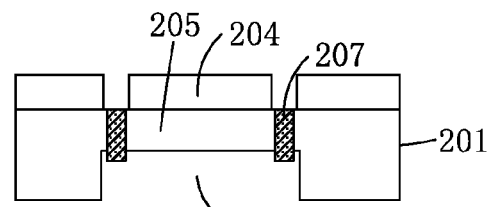

Fourthly, referring to FIG. 14, the single-crystal silicon film 204 is then etched to form a diagram of a mass block 205.

Fifthly, referring to FIG. 14, a back cavity 206 is then formed by etching a bottom surface of the single-crystal silicon wafer 201. The mass block 205 and the corresponding single-crystal silicon wafer 201 are separated from each other by the sacrificial layer 207.

Figure 15:
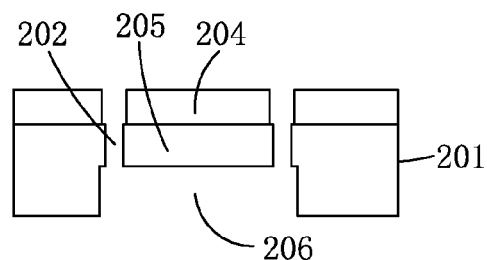
Figure 16:
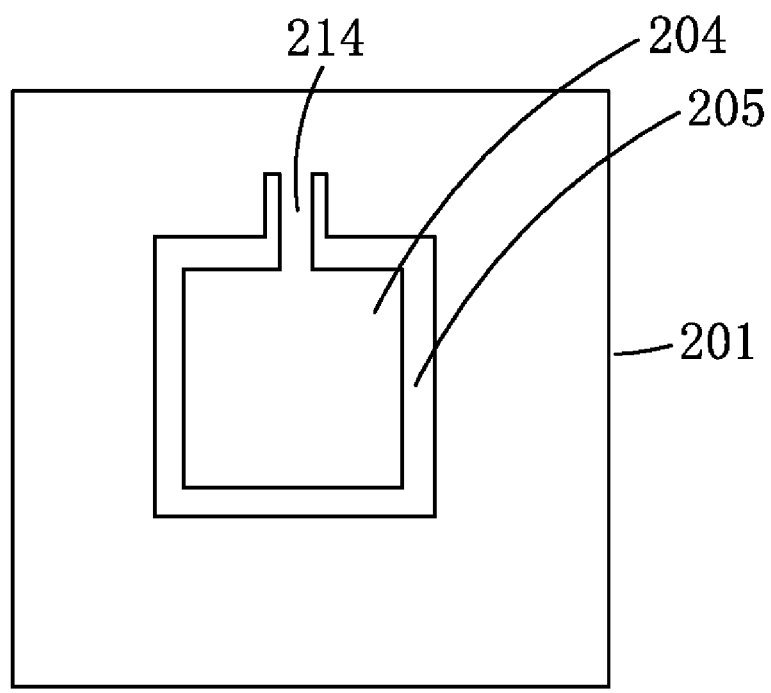
FIG. 16 is a top view of the mass block shown in FIG. 15.

Finally, referring to FIGS. 15 and 16, the sacrificial layer 207 is then removed via a reactive ion etching process or a wet etching process in order to communicating the mass block 205 with the corresponding single-crystal silicon wafer 201. As a result, the mass block 205 is released to be a movable structure.

According to the second embodiment of the present invention, the single-crystal silicon film 204 can not be etched in the following etching processes as a result that the thickness of the single-crystal silicon film 204 can be well controlled.

Please refer to FIGS. 17-27, a method for fabricating a cantilever beam of a MEMS sensor according to a third embodiment of the present invention is disclosed and includes the following steps.

Figure 17:
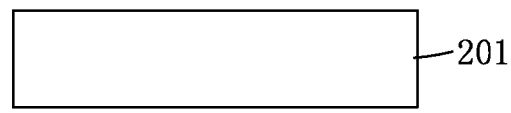
FIGS. 17-27 are schematic views showing steps for manufacturing a cantilever beam of a MEMS sensor according to another embodiment of the present invention.
Figure 18:
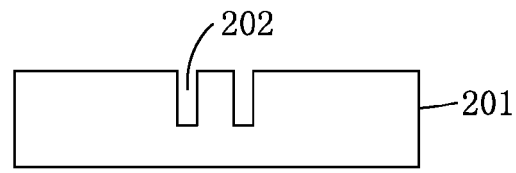

Please refer to FIGS. 17 and 18, firstly, a top surface of a single-crystal silicon wafer 201 is etched via an etching process, such as a photo etching process or a dry etching process or a wet etching process, in order to form a deep hole 202. The deep hole 202 further extends into an inner side of the single-crystal silicon wafer 201.

Figure 19:
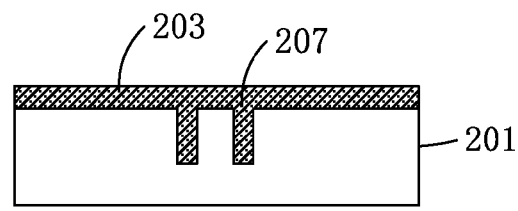

Secondly, referring to FIG. 19, a medium layer 203 is then formed on the top surface of the single-crystal silicon wafer 201 via a deposition process, such as a Low Pressure Chemical Vapor Deposition (LPCVD) process or a Plasma Enhanced Chemical Vapor Deposition (PEVCD) process or a thermal oxidation process. The medium layer 203 is made of silicon oxide or silicon nitride and fills in the deep hole 202 to form a sacrificial layer 207. The medium layer 203 functions as a mask layer in the following etching processes.

Figure 20:
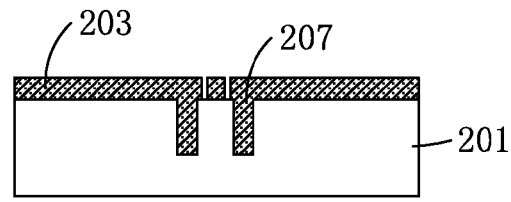

Thirdly, referring to FIG. 20, the medium layer 203 is partly removed by Buffered Oxide Etchant (BOE) to form a mask diagram on the medium layer 203. However, the sacrificial layer 207 is not etched by the prior etching process and still exists because of the protection characteristics of such etching process.

Figure 21:
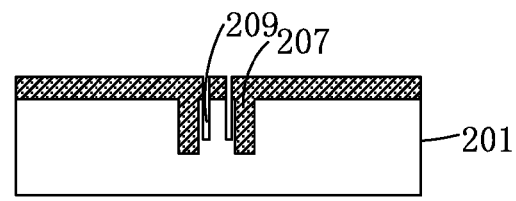

Fourthly, referring to FIG. 21, the single-crystal silicon wafer 201 is then etched through the mask diagram via a Deep Reactive Ion Etching (DRIE) process to form a plurality of trenches 209.

Figure 22:
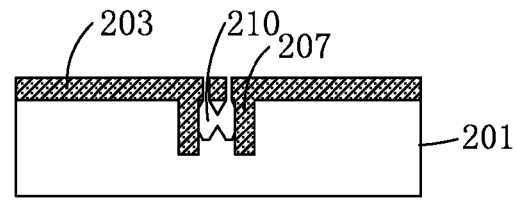

Fifthly, referring to FIG. 22, the single-crystal silicon wafer 201 is then partly etched through the medium layer 203 via an anisotropic DRIE process together with an anisotropic etching process, or an independent anisotropic DRIE process, or an independent isotropic DRIE process, to form an inner chamber 210 and a plurality of remainder single-crystal silicon chips 213 located under the medium layer 203. Such remainder single-crystal silicon chips 213 form a girder-shaped silicon film. The trenches 209 are in communication with each other through the inner chamber 210 inside the single-crystal silicon wafer 201.

Referring to FIG. 22, the anisotropic etching process includes infusing KOH or tetramethylammonium hydroxide (TMAH) into the trenches 209 so as to etch the single-crystal silicon wafer 201. Because of the anisotropic characteristic of such etching process, each remainder single-crystal silicon chip 213 is etched to form a contractive end (not labeled) facing the inner chamber 210. According to the illustrated embodiment of the present invention, the contractive end has an inverted triangle shaped cross section taken along a vertical plane. Alternatively, the cross section can be of other shapes, such as rectangular etc.

If the anisotropic DRIE process is selected as an etching process, reactive ion is radiated into the single-crystal silicon wafer 201 through the trenches 209. Under suitable technical parameter, the meshwork silicon film 213 can be formed as well.

Similar to FIG. 5(b), it is easy to be understood that the isotropic DRIE process can also be selected as an etching process to form the meshwork silicon film 213.

Besides, the above-mentioned anisotropic DRIE process together with the anisotropic etching process can be combined to form the meshwork silicon film 213 as well.

Figure 23:
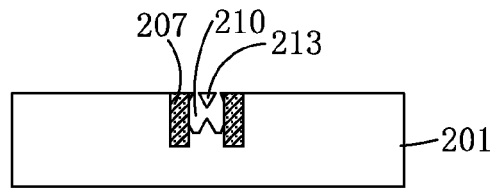

Sixthly, referring to FIG. 23, the medium layer 203 is then removed from the single-crystal silicon wafer 201 in order to expose the girder-shaped silicon film, via a dry etching process such as a reactive ion etching process, or a wet etching process such as using the Buffered Oxide Etchant (BOE).

Figure 24:
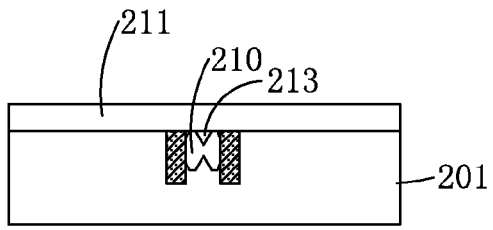

Seventhly, referring to FIG. 24, a single-crystal silicon film 211 is then expanded based on the girder-shaped silicon film via an epitaxial growth process. The thickness of the independent single-crystal silicon film 211 is easy to control. The single-crystal silicon film 211 is integrated because the epitaxial growth process is isotropic. As a result, the single-crystal silicon film 211 covers the girder-shaped silicon film and shields the trenches 209. The inner chamber 210 is located under the single-crystal silicon film 211. The single-crystal silicon film 211 can be used as a pressure-sensitive film of a pressure sensor or a diaphragm of other components.

Figure 25:
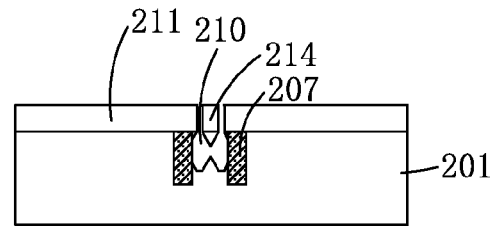

Eighthly, as shown in FIG. 25, a diagram of at least one cantilever beam 214 is then fabricated on the single-crystal silicon film 211. However, the amount of the diagram can be single or multiple so that the amount of the cantilever beam 214 can be single or multiple, accordingly.

Figure 26:
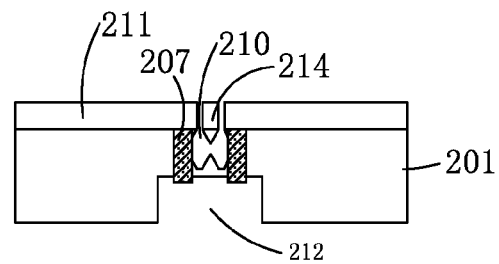

Ninthly, referring to FIG. 26, a back cavity 212 is then formed from a bottom surface of the single-crystal silicon wafer 201 via a photo etching process or a DRIE process. The back cavity 212 and the inner chamber 210 are not communicated with each other and are separated from each other by the sacrificial layer 207. Under this condition, the thickness of the cantilever beam 214 can not be influenced by the etching processes so that the thickness can be well controlled.

Figure 27:
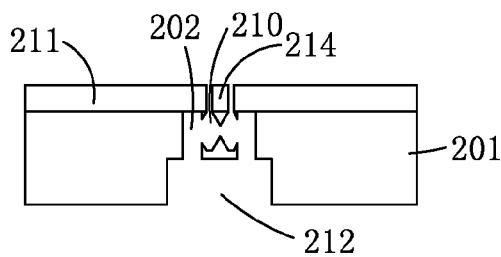

Finally, referring to FIG. 27, the sacrificial layer 207 is then removed via a reactive ion etching process or a wet etching process in order to communicate the back cavity 212 with the inner chamber 210. As a result, the cantilever beam 214 is released to be a movable structure.

The single-crystal silicon film 211 can not be etched in the following etching processes as a result that the thickness of the single-crystal silicon film 211 can be well controlled. In the traditional etching process, the diaphragm will further be etched when the silicon wafer is etched from its bottom surface. As a result, the thickness of the diaphragm can't be well controlled. However, the current fabrication method of the third embodiment of the present invention can overcome such difficulty of the traditional method. Besides, the current fabrication method is simple and useful because no additional apparatus, such as the expensive potentiostats or clip tools for protecting the silicon wafer, is needed.

Please refer to FIGS. 28-40, a method for fabricating a MEMS sensor, such as a piezoresistive pressure sensor and an acceleration sensor on a same single-crystal silicon wafer, according to a fourth embodiment of the present invention is disclosed based upon the combination of the above methods of the first, the second and the third embodiments, and some additional processes of piezoresistance fabrication and metal trace fabrication. The single-crystal silicon wafer is divided into a first area for fabricating the piezoresistive pressure sensor and a second area for fabricating the acceleration sensor. The piezoresistive pressure sensor and the acceleration sensor are separated from each other by a broken line. Such method includes the following steps.

Figure 28:
FIGS. 28-39 are schematic views showing steps for manufacturing a MEMS sensor according to another embodiment of the present invention.
Figure 29:
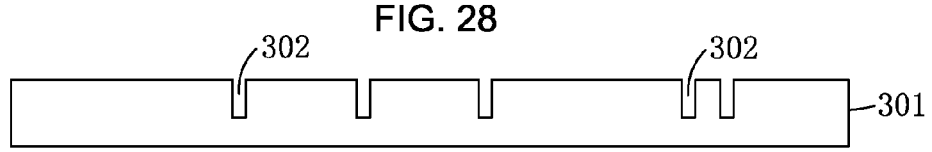

Please refer to FIGS. 28 and 29, firstly, a plurality of deep holes 302 are formed by etching a top surface of a single-crystal silicon wafer 301. The deep holes 302 can be used to communicate with a chamber in order to fabricate the piezoresistive pressure sensor, or can be used to release a mass block and a cantilever beam in order to fabricate the acceleration sensor.

Figure 30:
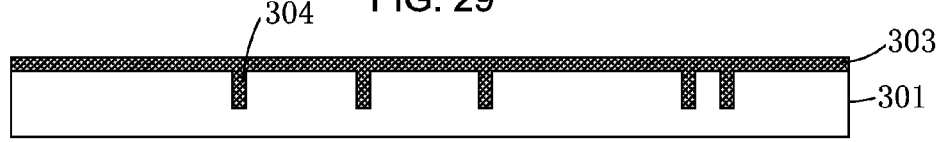

Secondly, as shown in FIG. 30, a medium layer 303 is then formed on the top surface of the single-crystal silicon wafer 301 via a deposition process, such as a Low Pressure Chemical Vapor Deposition (LPCVD) process or a Plasma Enhanced Chemical Vapor Deposition (PEVCD) process or a thermal oxidation process. The medium layer 303 is made of silicon oxide or silicon nitride and fills in the deep hole 302 to form a sacrificial layer 304. The medium layer 303 functions as a mask layer in the following etching processes.

Figure 31:
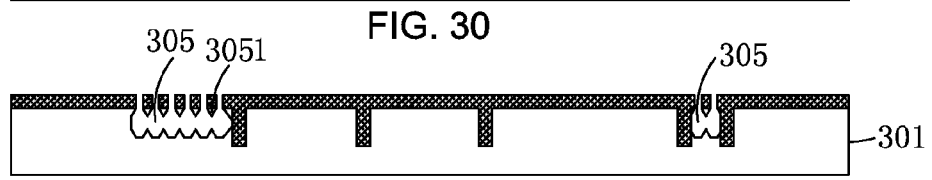

Thirdly, referring to FIG. 31, the single-crystal silicon wafer 301 is partly etched from trenches defined through the medium layer 303 to form a chamber 305 and a plurality of remainder single-crystal silicon chips 3051 under the medium layer 303, via an anisotropic DRIE process together with an anisotropic etching process, or an independent anisotropic DRIE process, or an independent isotropic DRIE process disclosed in the FIGS. 10-16 and 17-27. The remainder single-crystal silicon chips 3051 form a meshwork silicon film and each remainder single-crystal silicon chip 3051 has an inverted triangle shaped cross section taken along a vertical plane. The single-crystal silicon wafer 301 is etched to terminate at the sacrificial layer 304.

Figure 32:
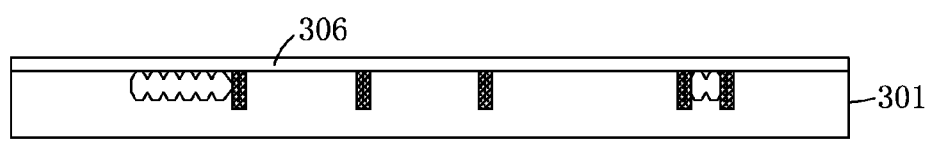

Fourthly, referring to FIG. 32, the medium layer 303 is removed by Buffered Oxide Etchant (BOE) to expose the meshwork silicon film. However, the sacrificial layer 304 is not etched by such etching process and still exists because of the protection characteristics of such etching process. Then, a single-crystal silicon film 306 is expanded based on the meshwork silicon film via an epitaxial growth process so as to cover the meshwork silicon film.

Figure 33:
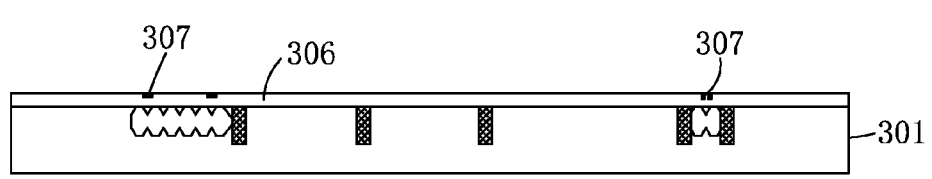

Fifthly, referring to FIG. 33, a plurality of piezoresistances 307 are fabricated on the single-crystal silicon film 306 via a photo etching process, an injection process and annealing process etc.

Figure 34:
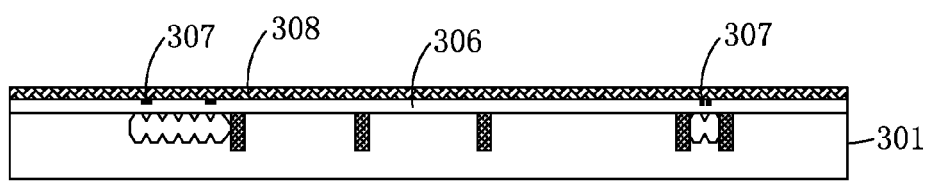

Sixthly, referring to FIG. 34, a passivation layer 308 is then fabricated on the single-crystal silicon film 306 and covering the single-crystal silicon film 306, via a LPCVD process or a PEVCD process. The passivation layer 308 can be made of silicon oxide or silicon nitride.

Figure 35:
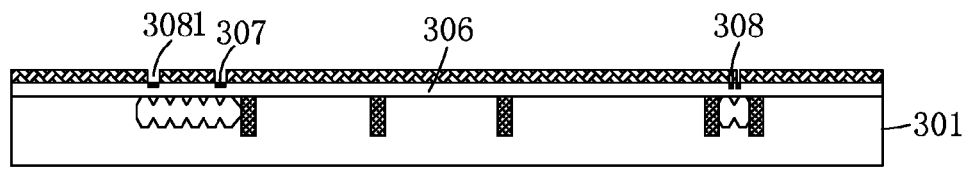

Seventhly, referring to FIG. 35, a plurality of through holes 3081 corresponding to and connecting the piezoresistances 307 are formed by etching the passivation layer 308.

Figure 36:
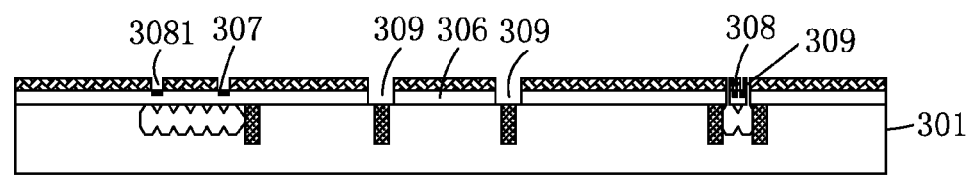

Eighthly, as shown in FIG. 36, a plurality of metal pads 312 and metal traces 310 are formed on the passivation layer 308, via a metal deposition process or a photo etching process or a metal etching process. The metal traces 310 fill in the through holes 3081, and connect the corresponding metal pads 312 and the piezoresistances 307 in order to extend the piezoresistances 307 beyond a top surface of the passivation layer 308. The passivation layer 308 is adapted for insulate the single-crystal silicon film 306 and the metal traces 310.

Figure 37:
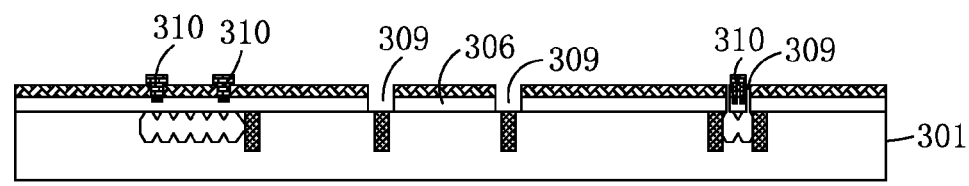

Ninthly, referring to FIG. 37, diagrams 309 of a cantilever beam and a mass block are then formed on the passivation layer 308.

Figure 38:
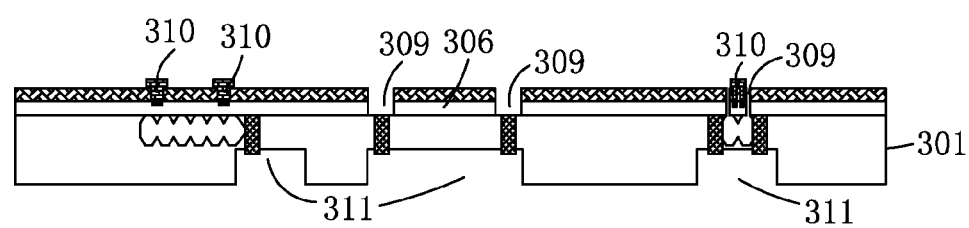

Tenthly, referring to FIG. 38, a back cavity 311 is then formed from a bottom surface of the single-crystal silicon wafer 301 via a photo etching process or a DRIE process. The back cavity 311 and the chamber 305 are not communicated with each other and are separated from each other by the sacrificial layer 304. Under this condition, the thickness of the single-crystal silicon film 306 can not be influenced by the following etching processes so that the thickness thereof can be well controlled.

Figure 39:
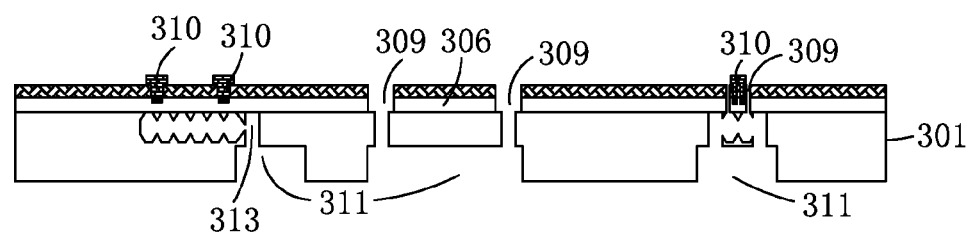
Figure 40:
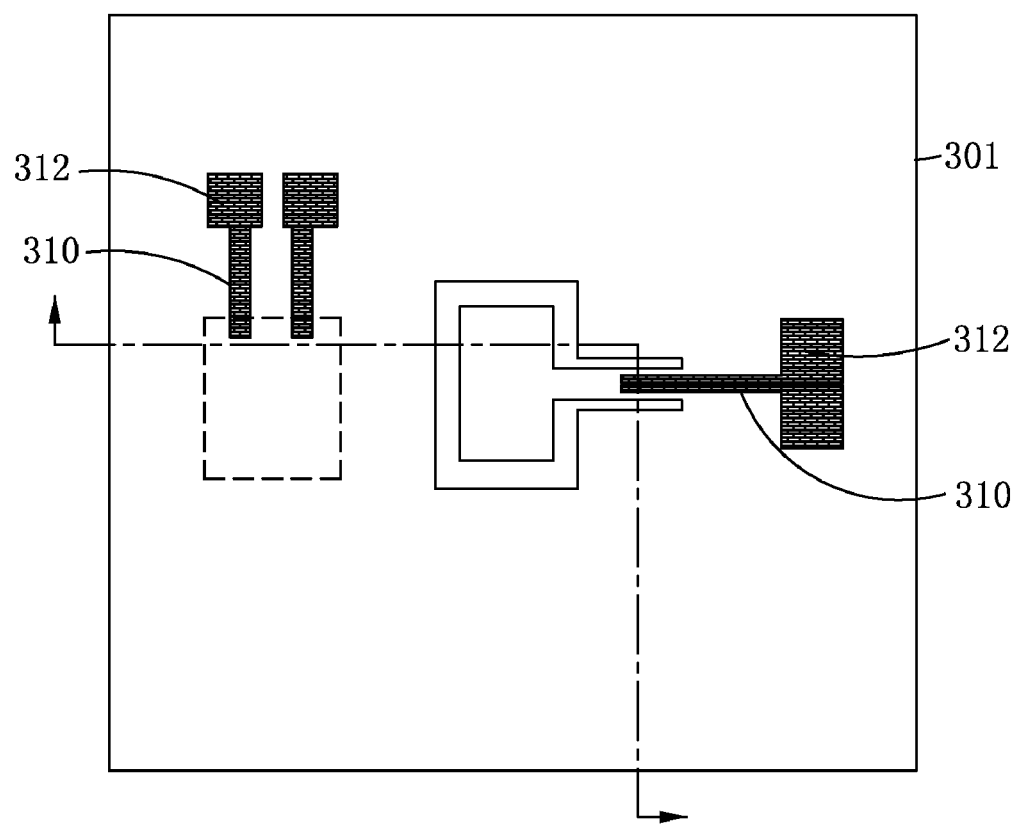
FIG. 40 is a top view of the MEMS sensor as shown in FIG. 39.

Finally, referring to FIG. 39, the sacrificial layer 304 is then removed via a reactive ion etching process or a wet etching process in order to communicate the back cavity 311 and the chamber 305. As a result, the cantilever beam and the mass block are both released to be movable structures to form the piezoresistive pressure sensor and the acceleration sensor, respectively. The part shown at the left side of the broken line is the piezoresistive pressure sensor, and the part shown at the right side of the broken line is the acceleration sensor. According to the fourth embodiment of the present invention, the piezoresistive pressure sensor and the acceleration sensor are commonly fabricated by a single single-crystal silicon wafer 301 to realize cost-effective manufacturing.

It is noted that the above ninthly step of the fourth embodiment is not needed when only the piezoresistive pressure sensors are fabricated. Under this condition, the single-crystal silicon film 306 will be driven to deform when the outer pressure is applied thereto. As a result, the piezoresistance of the single-crystal silicon film 306 is changed, which will result in a signal outputted by the metal traces 310. However, when the MEMS sensor is an acceleration sensor, the above ninthly step of the fourth embodiment is needed. Under this condition, the mass block will be driven to offset a distance when the outer acceleration is applied thereto. As a result, the cantilever beam deforms to output a changed signal transmitted by the metal traces 310. Besides, an additional mass block similar to FIGS. 10-16 can be fabricated on the single-crystal silicon film 306. The additional mass block is moveable and is in communication with the chamber 305. The additional mass block increases the stress raiser to improve resolution so that the MEMS sensor can be more suitable for slight pressure measurement.

It is to be understood, however, that even though numerous, characteristics and advantages of the present invention have been set forth in the foregoing description, together with details of the structure and function of the invention, the disclosed is illustrative only, and changes may be made in detail, especially in matters of number, shape, size, and arrangement of parts within the principles of the invention to the full extent indicated by the broad general meaning of the terms in which the appended claims are expressed.

What is claimed is:

1. A method for manufacturing a thin film of a Micro-Electro-Mechanical System (MEMS) sensor, comprising steps of:
   a) forming a medium layer on a top surface of a single-crystal silicon wafer via a deposition process, and the medium layer functioning as a mask layer;
   b) partly removing the medium layer in order to form a mask diagram;
   c) etching the single-crystal silicon wafer from the mask diagram via a Deep Reactive Ion Etching (DRIE) process to form a plurality of trenches extending into an inner side of the single-crystal silicon wafer;
   d) partly etching the single-crystal silicon wafer through the mask diagram via an independent isotropic DRIE process, to form an inner chamber and a plurality of remainder single-crystal silicon chips under the medium layer, the trenches being in communication with the inner chamber, the remainder single-crystal silicon chips forming a meshwork silicon film;
   e) removing the medium layer from the single-crystal silicon wafer in order to expose the meshwork silicon film, via a dry etching process or a wet etching process; and
   f) finally, expanding a single-crystal silicon film based on the meshwork silicon film via an epitaxial growth process, the single-crystal silicon film covering the meshwork silicon film to shield the trenches, the inner chamber being located under the single-crystal silicon film.

2. The method for manufacturing the thin film as claimed in claim 1, wherein the medium layer is made of silicon oxide or silicon nitride.

3. The method for manufacturing the thin film as claimed in claim 1, wherein the deposition process comprises a Low Pressure Chemical Vapor Deposition (LPCVD) process or a Plasma Enhanced Chemical Vapor Deposition (PEVCD) process or a thermal oxidation process.

4. The method for manufacturing the thin film as claimed in claim 1, wherein, in the step b), the mask diagram is formed by a photo etching process or a dry etching process or a wet etching process.

5. The method for manufacturing the thin film as claimed in claim 1, wherein an inner side of the inner chamber is curved.

6. The method for manufacturing the thin film as claimed in claim 1, wherein, in the step e), the medium layer is etched by Buffered Oxide Etchant (BOE).

7. The method for manufacturing the thin film as claimed in claim 1, wherein, in the step e), the medium layer is removed by a reactive ion etching process.

8. The method for manufacturing the thin film as claimed in claim 1, wherein, in the step d), each remainder single-crystal silicon chip is etched to form a contractive end facing the inner chamber, the contractive end comprising an inverted triangle shaped cross section taken along a vertical plane.

9. A method for manufacturing a thin film of a Micro-Electro-Mechanical System (MEMS) sensor, comprising steps of:
   a) forming a medium layer on a top surface of a single-crystal silicon wafer via a deposition process, and the medium layer functioning as a mask layer;
   b) partly removing the medium layer in order to form a mask diagram;
   c) etching the single-crystal silicon wafer from the mask diagram via a Deep Reactive Ion Etching (DRIE) process to form a plurality of trenches extending into an inner side of the single-crystal silicon wafer;
   d) partly etching the single-crystal silicon wafer through the trenches via an anisotropic DRIE process together with an anisotropic etching process, or an independent anisotropic DRIE process, or an independent isotropic DRIE process, to form an inner chamber and a plurality of remainder single-crystal silicon chips under the medium layer, the trenches being in communication with each other through the inner chamber, the remainder single-crystal silicon chips forming a meshwork silicon film;
   e) removing the medium layer from the single-crystal silicon wafer in order to expose the meshwork silicon film, via a dry etching process or a wet etching process;
   f) forming a deposition layer filled in the trenches so as to close the inner chamber, the deposition layer further covering the top surface of the single-crystal silicon wafer; and
   g) finally, removing the unwanted deposition layer which covers the top surface of the single-crystal silicon wafer while leaving the deposition layer filled in the trenches, the meshwork silicon film and the deposition layer filled in the trenches being exposed to an exterior and jointly forming the thin film.

10. The method for manufacturing the thin film as claimed in claim 9, wherein the deposition layer is made of polycrystalline silicon or silicon oxide.

11. The method for manufacturing the thin film as claimed in claim 9, wherein, in the step d), the independent isotropic DRIE process is selected as an etching process for etching the single-crystal silicon wafer, the independent isotropic DRIE process comprising a passivation step by forming a passivation layer which covers inner sides of the trenches.

12. The method for manufacturing the thin film as claimed in claim 11, wherein after the passivation step, a reactive ion is radiated into the single-crystal silicon wafer through the trenches to etch the single-crystal silicon wafer.

13. The method for manufacturing the thin film as claimed in claim 12, wherein, in the step d), an inner side of the inner chamber is curved.

14. A method for manufacturing a piezoresistive pressure sensor and an acceleration sensor on a same single-crystal silicon wafer, the single-crystal silicon wafer being divided into a first area for fabricating the piezoresistive pressure sensor and a second area for fabricating the acceleration sensor, the method comprising steps of:
   a) etching a top surface of the single-crystal silicon wafer to form a first deep hole at the first area and a second deep hole at the second area;
   b) depositing a medium layer on the top surface of the single-crystal silicon wafer under an arrangement that the medium layer fills in the first and the second deep holes to form first and second sacrificial layers, respectively;
   c) partly etching the single-crystal silicon wafer through the medium layer to form first and second chambers and a plurality of remainder single-crystal silicon chips under the medium layer, the first and the second chambers being located at the first and the second areas, respectively, the single-crystal silicon wafer being etched to terminate at the first sacrificial layer which is located adjacent to the first chamber, and the single-crystal silicon wafer being etched to terminate at the second sacrificial layer which is located adjacent to the second chamber;
   d) removing the medium layer from the single-crystal silicon wafer at both the first and the second areas, while leaving the first and the second sacrificial layer;
   e) fabricating a single-crystal silicon film at the first and the second areas, and then fabricating a first piezoresistance on the single-crystal silicon film at the first area, and a second piezoresistance on the single-crystal silicon film at the second area, the first and the second piezoresistances being electrically extended to an exterior;
   f) forming first and second back cavities from a bottom surface of the single-crystal silicon wafer under a condition that the first back cavity and the first chamber are separated from each other by the first sacrificial layer, and the second back cavity and the second chamber are separated from each other by the second sacrificial layer; and
   g) finally, removing the first and the second sacrificial layers so as to communicate the first back cavity with the first chamber, the second back cavity communicating with the second chamber to release a mass block movable in the second chamber, the mass block being adapted for sensing the acceleration.

15. The method as claimed in claim 14, further comprising a step of forming a plurality of trenches by etching the top surface of the single-crystal silicon wafer between the steps b) and c).

16. The method as claimed in claim 15, wherein in the step c), the single-crystal silicon wafer is partly etched through the trenches via an anisotropic DRIE process together with an anisotropic etching process, or an independent anisotropic DRIE process, or an independent isotropic DRIE process, to form the first and the second chambers.

17. The method as claimed in claim 15, wherein the remainder single crystal silicon chips form a meshwork silicon film, the single-crystal silicon film being formed on the meshwork silicon film via an epitaxial growth process to shield the trenches.

18. The method as claimed in claim 15, wherein, in the step e), fabricating the single-crystal silicon film comprises a step of forming a deposition layer filled in the trenches so as to close the first and the second chamber, and a subsequent step of removing unwanted the deposition layer which covers the top surface of the single-crystal silicon wafer while leaving the deposition layer filled in the trenches, the remainder single-crystal silicon chips and the deposition layer filled in the trenches jointly forming the single-crystal silicon film.

19. The method as claimed in claim 14, between the steps e) and f), further comprising the following steps:
   e.1) fabricating a passivation layer covering the single-crystal silicon film;
   e.2) etching the passivation layer to form first and second through holes corresponding to the first and the second piezoresistances, respectively; and
   e.3) fabricating first and second metal pads on the passivation layer and first and second metal traces filling in the first and the second through holes, via a metal deposition process or a photo etching process or a metal etching process, the first metal trace connecting the first metal pad and the first piezoresistance, and the second metal trace connecting the second metal pad and the second piezoresistance.

20. The method as claimed in claim 14, wherein the step g) further comprises another mass block released by the first sacrificial layer, the another mass block being movable in the first chamber for slight pressure measurement.

* * * * *